(12) United States Patent
Jung

(10) Patent No.: US 7,148,139 B2
(45) Date of Patent: Dec. 12, 2006

(54) METHOD FOR FORMING METAL WIRING OF SEMICONDUCTOR DEVICE

(75) Inventor: Byung-Hyun Jung, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,609

(22) Filed: Dec. 30, 2004

(65) Prior Publication Data

US 2005/0142842 A1 Jun. 30, 2005

(30) Foreign Application Priority Data

Dec. 31, 2003 (KR) ........................ 10-2003-0101828

(51) Int. Cl.
*H01L 21/4763* (2006.01)
(52) U.S. Cl. ................. 438/644; 438/643; 257/E21.584
(58) Field of Classification Search ............... 438/637, 438/643, 644, 658; 257/E21.584
See application file for complete search history.

(56) References Cited

U.S. PATENT DOCUMENTS

| 6,077,780 | A * | 6/2000 | Dubin ......................... 438/687 |
| 6,214,731 | B1 * | 4/2001 | Nogami et al. ............. 438/687 |
| 6,271,136 | B1 * | 8/2001 | Shue et al. ................. 438/687 |
| 6,475,912 | B1 * | 11/2002 | Harada ........................ 438/687 |

* cited by examiner

*Primary Examiner*—Caridad Everhart
(74) *Attorney, Agent, or Firm*—Mayer, Brown, Rowe & Maw LLP

(57) ABSTRACT

A method for forming a metal wiring of a semiconductor includes forming an inter metal dielectric layer on a semiconductor substrate having a predetermined low structure with a conductive layer. A plurality of contact holes is formed to expose the conductive layer through the inter metal dielectric layer. A first titanium nitride layer is formed on sidewalls of the contact holes. The first titanium nitride layer is plasma processed. A first titanium silicon nitride layer is formed on the first titanium nitride layer. Metal plugs are formed on the first titanium silicon nitride layer. The metal plugs, the first titanium silicon nitride layer, and the first titanium nitride layer are polished to expose the inter metal dielectric layer. Metal wirings are formed to cover the contact holes.

15 Claims, 2 Drawing Sheets

METHOD FOR FORMING METAL WIRING OF SEMICONDUCTOR DEVICE

BACKGROUND OF THE INVENTION (a) Field of the Invention

The present invention relates to a method for forming metal wirings of a semiconductor device.

(b) Discussion of the Related Art

Typically, in a semiconductor metal wirings are formed from conductive materials for electrically connecting the semiconductor devices and pads on a semiconductor substrate. Examples of conductive materials include aluminum, aluminum alloy, copper, and the like.

In order to connect the electrodes and pads isolated by dielectric layers of oxide, contact holes are formed by selectively etching the dielectric layers, and metal plugs are filled inside the holes. The metal wirings are formed by depositing and patterning a metal thin layer.

The metal plugs are formed from tungsten or copper, and a titanium nitride (Tin) layer is formed on inner walls of the contact hole to prevent diffusion of the tungsten or the copper through a CVD process.

However, the TiN layer formed in such manner contains impurities, such as C and N, which displace the TiN layer. Thus, the impurities reduce the protection against diffusion as well as cause high resistance.

In order to solve this problem, a known plasma process uses $N_2$ and $H_2$ gases to reduce the resistance of the TiN layer and to increase concentrations of the TiN layer, thereby increasing the protection against diffusion.

However, the known plasma process does not work well on the sidewalls of the contact holes, and thus current leakages occur between the contact holes.

SUMMARY OF THE INVENTION

To address the above-described and other problems, the present invention advantageously provides a method for forming a metal wiring of a semiconductor. An inter metal dielectric layer is formed on a semiconductor substrate having a predetermined low structure with a conductive layer. A plurality of contact holes is formed to expose the conductive layer through the inter metal dielectric layer. A first titanium nitride layer is formed on sidewalls of the contact holes. The first titanium nitride layer is plasma processed. A first titanium silicon nitride layer is formed on the first titanium nitride layer. Metal plugs are formed on the first titanium silicon nitride layer. The metal plugs, the first titanium silicon nitride layer, and the first titanium nitride layer are polished to expose the inter metal dielectric layer. Metal wirings are formed to cover the contact holes.

The present invention further provides a method for forming a metal wiring of a semiconductor. A dielectric layer is formed on a semiconductor substrate. A contact hole is formed to expose a conductive layer of the substrate through the dielectric layer. A first nitride layer is formed on a sidewall of the contact hole. The first nitride layer is plasma processed. A second nitride layer is formed on the first nitride layer. A metal plug is formed on the second nitride layer. The metal plug and the first and second nitride layers are polished to expose the dielectric layer. A metal wiring is formed to cover the contact hole.

It is to be understood that both the foregoing general description of the invention and the following detailed description are exemplary, but are not restrictive of the invention.

BRIEF DESCRIPTION OF THE DRAWINGS

The accompanying drawings, which are included to provide a further understanding of the invention and are incorporated in and constitute a part of this application, illustrate aspects of the invention and together with the description serve to explain the principle of the invention.

DETAILED DESCRIPTION OF THE INVENTION

Figure 1:
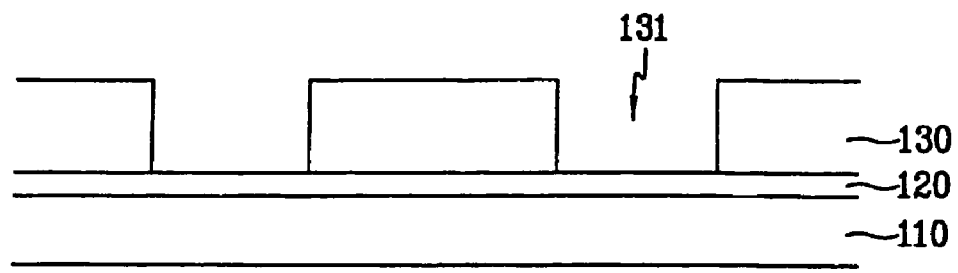
FIGS. 1–6 are cross-sectional views illustrating a method for forming metal wirings of a semiconductor device.

With reference to the accompanying drawings, the present invention is now described. However, it is to be understood that the invention is not limited to the disclosed embodiments, but rather is intended to cover various modifications and arrangements included within the spirit and scope of the claims.

To clarify multiple layers and regions, thickness of the layers are enlarged in the drawings. The same reference numbers are used throughout the drawings to refer to the same or similar parts. When a part such as a layer, film, area, or plate is described as positioned on another part, it is to be understood that the part can be disposed directly in contact with the other part or above the other part with at least one intermediate part disposed therebetween.

FIGS. 1–6 are cross-sectional views illustrating a method for forming metal wirings of a semiconductor device.

As shown in FIG. 1, in the method for forming the metal wirings of the semiconductor, an inter metal dielectric layer 130 is formed on a semiconductor substrate 110 having a predetermined low structure with a conductive layer 120. A plurality of contact holes 131 is formed on the inter metal dielectric 130 to expose the conductive layer 120.

Figure 2:
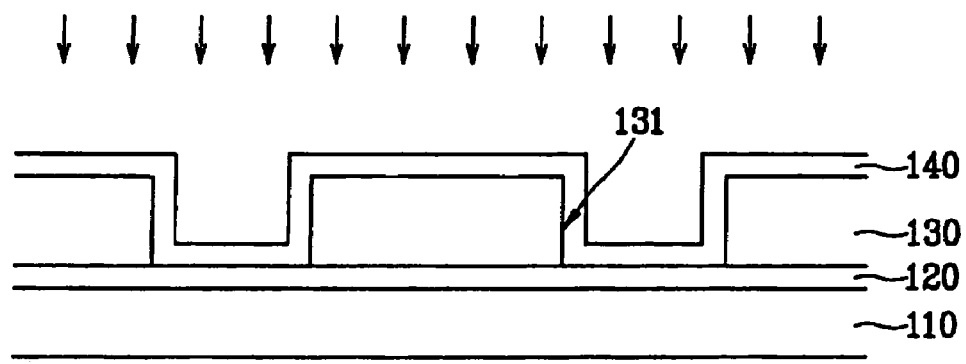

As shown in FIG. 2, a titanium nitride layer (TiN) 140 is formed on an entire surface of the inter metal dielectric layer 130 and inner walls of the contact holes 131. Preferably, the first titanium nitride layer 140 is formed through a CVD process at a temperature from about 300° C. to about 400° C., at a pressure from about 1 torr to about 10 torr, and/or by flowing TDMAT or TDEAT at a volumetric flow rate from about 100 sccm to about 500 sccm. Preferably, the first titanium nitride layer 140 is formed with a thickness from about 30 Å to about 60 Å.

The first titanium nitride layer 140 is plasma processed. Preferably, the layer 140 is processes with a gas including one or both of $N_2$ and $SiH_4$. Preferably, the plasma process is performed in a chamber identical to the chamber in which the CVD process is performed, by providing $N_2$ at a volumetric flow rate from about 200 sccm to about 500 sccm and $SiH_4$ at a volumetric flow rate from about 300 sccm to about 1000 sccm, for a time period from about 20 seconds to about 50 seconds, with an electric power from about 500 W to about 1000 W, and/or at a pressure from about 1 torr to about 3 torr. About half of the thickness of the first titanium nitride layer 140 is removed due to the removal of impurities, resulting in the first titanium nitride layer 141.

Figure 3:
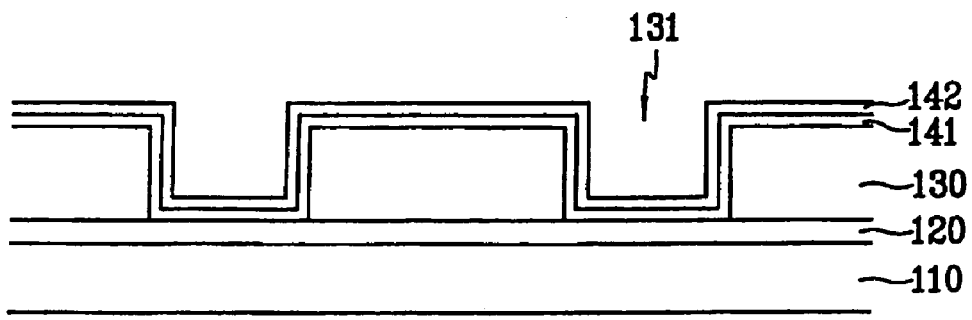

As shown in FIG. 3, a first titanium silicon nitride layer (TiSiN) 142 is formed on the first titanium nitride layer 141 through the CVD process. Preferably, the first titanium silicon nitride layer 142 is formed with a thickness from about 5 Å to about 10 Å.

Figure 4:
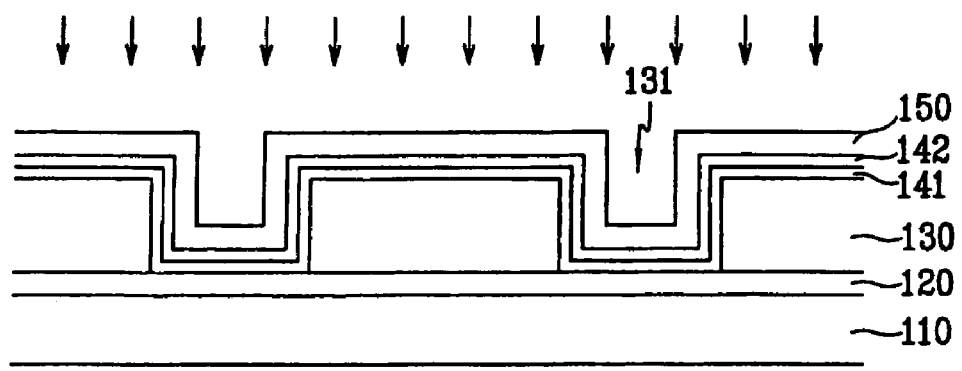

As shown in FIG. 4, a second titanium nitride layer 150 is formed on the first titanium silicon nitride layer 142 through the CVD process. Preferably, the second titanium nitride layer 150 is formed at a temperature from about 300°

C. to about 400° C., at a pressure of about 10 torr, and/or while providing TDMAT or TDEAT at a volumetric flow rate from about 100 sccm to 500 about sccm.

The second titanium nitride layer 150 is plasma processed. Preferably, the layer 150 is processed with a gas including one or both of $N_2$ and $SiH_4$. Preferably, the plasma process is performed in a chamber identical to the chamber in which the CVD process is performed, by providing $N_2$ at a volumetric flow rate from about 200 sccm to about 500 sccm and $SiH_4$ at a volumetric flow rate from about 300 sccm to about 1000 sccm, for a time period from about 20 second to about 50 seconds, with an electric power from about 500 W to about 1000 W, and/or at a pressure from about 1 torr to about 3 torr. About half of the thickness of the second titanium nitride layer 150 is removed due to the removal of impurities, resulting in the second titanium nitride layer 151.

Figure 5:
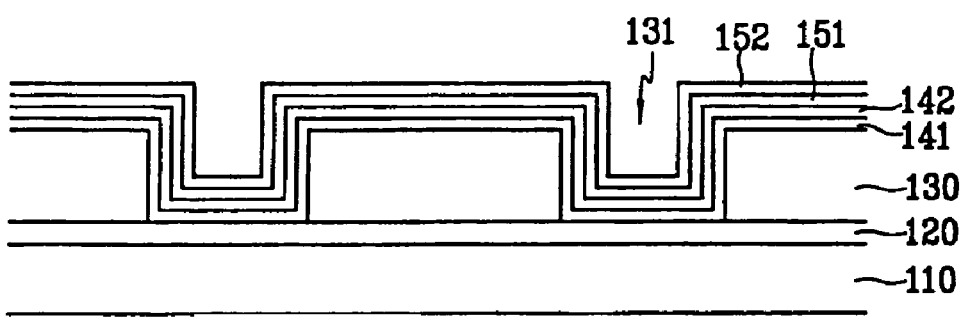

As shown in FIG. 5, a second titanium silicon nitride layer 152 is formed on the thickness-reduced second titanium nitride layer 151 through the CVD process. Preferably, the second titanium silicon nitride layer 152 has a thickness from about 5 Å to about 10 Å.

Figure 6:
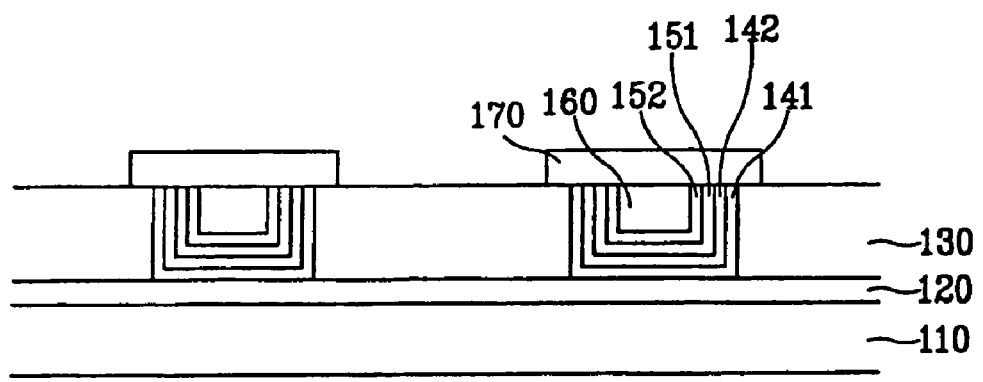

As shown in FIG. 6, a metal plug 160 is formed on the second titanium silicon nitride layer 152. Preferably, the metal plug 160 is formed from tungsten or copper. The metal plug 160, the first titanium silicon nitride layer 142, and the first titanium nitride layer 141 are polished until the inter metal dielectric layer 130 is exposed and that the first titanium nitride layer 141, the first titanium silicon nitride layer 142, the second titanium nitride layer 151, and second titanium silicon nitride layer 152 remain in the contact hole 131 to form a protective layer.

Preferably, metal wirings 170 are formed on the inter metal dielectric layer 130 to connect to the metal plug 160 inside the contact hole 131. Preferably, the metal wirings 170 are formed from aluminum or copper.

As discussed above, the first and second TiSiN layer 142 and 152, which have superior diffusion protection characteristic, are formed on the respective first and second TiN layer 141 and 151. Thus, by this arrangement, it is possible to avoid the occurrence of leakage currents through sidewalls of the contact holes 131.

In the method for forming the metal wirings of the semiconductor according to the present invention, the TiN layer acting as the diffusion protection layer on the sidewalls of the contact hole is plasma processed with $N_2$ and $SiH_4$ to remove the impurities from the TiN layer. Because the TiSiN layer formed on the TiN layer has superior diffusion protection characteristics, it is possible to avoid the occurrence of leakage currents through the sidewalls of the contact hole.

Although preferred embodiments of the present invention have been described in detail hereinabove, it should be clearly understood that many variations and/or modifications of the basic invention concepts herein taught which may appear to those skilled in the present art are within the spirit and scope of the present invention, as defined in the claims.

Korean Patent Application No. 10-2003-0101828, filed on Dec. 31, 2003, is incorporated by reference herein in its entirety.

What is claimed is:

1. A method for forming a metal wiring of a semiconductor, comprising:
   forming an inter metal dielectric layer on a semiconductor substrate having a predetermined low structure with a conductive layer;
   forming a plurality of contact holes to expose the conductive layer through the inter metal dielectric layer;
   forming a first titanium nitride layer on sidewalls of the contact holes;
   plasma processing the first titanium nitride layer;
   forming a first titanium silicon nitride layer on the first titanium nitride layer;
   forming a second titanium nitride layer on the first titanium silicon nitride layer;
   plasma processing the second titanium nitride layer with a mixture of $N_2$ and $SiH_4$;
   forming a second titanium silicon nitride layer on the second titanium nitride layer;
   forming metal plugs on the second titanium silicon nitride layer;
   polishing the metal plugs, the first titanium silicon nitride layer, and the first titanium nitride layer to expose the inter metal dielectric layer; and
   forming metal wirings to cover the contact holes.

2. The method according to claim 1, wherein the first titanium silicon nitride layer and the second titanium silicon nitride are formed with a thickness from about 5 Å to about 10 Å.

3. The method according to claim 1, wherein the first titanium nitride layer and the second titanium nitride layer are formed through a CVD process which is performed under at least one of the following conditions: with TDMAT at a volumetric flow rate from about 100 sccm to about 500 sccm; with TDEAT at a volumetric flow rate from about 100 sccm to about 500 seem; at a temperature from about 300° C. to 400° C.; and at a pressure from about 1 torr to about 10 torr.

4. The method according to claim 3, wherein the first titanium nitride layer and the second titanium nitride layer are formed with a thickness from about 30 Å to about 60 Å.

5. The method according to claim 1, wherein the plasma processing occurs with a gas including at least one of $N_2$ and $SiH_4$.

6. The method according to claim 5, wherein the plasma processing occurs with at least one of the $N_2$ provided at a volumetric flow rate from about 200 sccm to about 500 sccm, the $SiH_4$ provided at a volumetric flow rate from about 300 sccm to about 1000 sccm, at a pressure from about 1 torr to about 3 torr, and with an electric power from about 500 W to about 1000 W.

7. The method according to claim 5, wherein the plasma processing occurs with the $N_2$ provided at a volumetric flow rate from about 200 sccm to about 500 sccm and the $SiH_4$ is provided at a volumetric flow rate from about 300 sccm to about 1000 sccm for a time period from about 20 seconds to about 50 seconds.

8. A method for forming a metal wiring of a semiconductor, comprising:
   forming a dielectric layer on a semiconductor substrate;
   forming a contact hole to expose a conductive layer of the substrate through the dielectric layer;
   forming a first nitride layer on a sidewall of the contact hole;
   plasma processing the first nitride layer;
   forming a second nitride layer on the first nitride layer;
   forming a third nitride layer on the second nitride layer;
   plasma processing the third nitride layer;
   forming a fourth nitride layer on the third layer;
   forming a metal plug on the fourth nitride layer;
   polishing the metal plug and the first, second, third, and fourth nitride layers to expose the dielectric layer; and
   forming a metal wiring to cover the contact hole.

9. The method according to claim 8, wherein the first and second nitride layers comprise at least one of titanium nitride and titanium silicon nitride.

10. The method according to claim 9, wherein the first nitride layer comprises titanium nitride and the second nitride layer comprises titanium silicon nitride.

11. The method according to claim 10 wherein the third and fourth nitride layers comprise at least one of titanium nitride and titanium silicon nitride.

12. The method according to claim 11, wherein the third nitride layer comprises titanium nitride and the fourth nitride layer comprises titanium silicon nitride.

13. The method according to claim 12, wherein at least one of the plasma processing the first nitride layer and plasma processing the third nitride layer comprises using a gas.

14. The method according to claim 13, wherein the gas comprises a mixed gas including at least one of $N_2$ and $SiH_4$.

15. The method according to claim 14, wherein the plasma processing the first nitride layer occurs with the $N_2$ provided at a volumetric flow rate from about 200 sccm to about 500 sccm and the $SiH_4$ is provided at a volumetric flow rate from about 300 sccm to about 1000 sccm.

* * * * *